United States Patent
Chang et al.

(10) Patent No.: US 8,551,613 B2
(45) Date of Patent: Oct. 8, 2013

(54) COATED ARTICLE AND METHOD FOR MANUFACTURING SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Shyan-Juh Liu, Tu-Cheng (TW); Cong Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 121 days.

(21) Appl. No.: 13/164,295

(22) Filed: Jun. 20, 2011

(65) Prior Publication Data

US 2012/0183765 A1    Jul. 19, 2012

(30) Foreign Application Priority Data

Jan. 17, 2011   (CN) .......................... 2011 1 0009230

(51) Int. Cl.
*B32B 15/04* (2006.01)
*C23C 14/34* (2006.01)
*C09K 3/00* (2006.01)

(52) U.S. Cl.
USPC .......................... 428/336; 428/472; 252/387

(58) Field of Classification Search
None
See application file for complete search history.

(56) References Cited

U.S. PATENT DOCUMENTS

| 7,583,479 B2* | 9/2009 | Umehara et al. | 360/320 |
| 2005/0270694 A1* | 12/2005 | Umehara et al. | 360/126 |
| 2007/0210459 A1* | 9/2007 | Burrows et al. | 257/790 |
| 2008/0016684 A1* | 1/2008 | Olechnowicz et al. | 29/748 |
| 2010/0134005 A1* | 6/2010 | Zheng et al. | 313/634 |

FOREIGN PATENT DOCUMENTS

| JP | 1-92354 A | 4/1989 |
| TW | 200303934 A | 9/2003 |

* cited by examiner

*Primary Examiner* — Vera Katz
(74) *Attorney, Agent, or Firm* — Altis Law Group, Inc.

(57) ABSTRACT

A coated article, includes a substrate, an anti-corrosion layer deposited on the substrate, the anti-corrosion layer being composed of $ZrW_2O_8$ and AlON. The disclosure also describes a method to make the coated article.

6 Claims, 2 Drawing Sheets

COATED ARTICLE AND METHOD FOR MANUFACTURING SAME

This application claims priority from Chinese patent application No.20110009230.0, filed on Jan. 17, 2005.

BACKGROUND

1. Technical Field

The exemplary disclosure generally relates to coated articles and a method for manufacturing the coated articles.

2. Description of Related Art

With the development of wireless communication and information processing technology, portable electronic devices such as mobile telephones and electronic notebooks are now in widespread use. Aluminum alloy and magnesium alloy have good heat dissipation and can effectively shield electromagnetic interference, and thus have been widely used for coated articles of the portable electronic devices. However, aluminum alloy and magnesium alloys have low corrosion resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
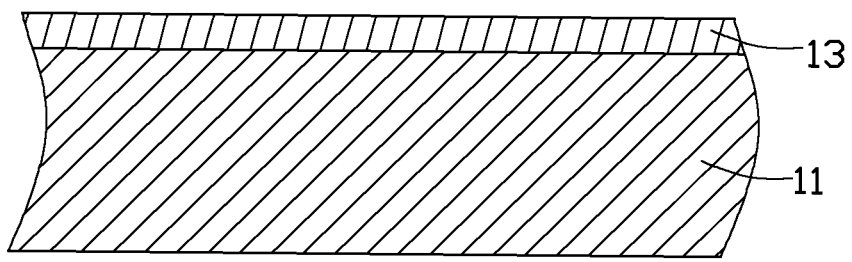
FIG. 1 is a cross-section view of an exemplary embodiment of coated article.

FIG. 1 shows an exemplary embodiment of a coated article 10 including a substrate 11 and an anti-corrosion layer 13 deposited on the substrate 11.

The substrate 11 can be made of metallic material, such as aluminum, aluminum alloy, magnesium or magnesium alloy.

The anti-corrosion layer 13 substantially comprising $ZrW_2O_8$ and AlON, wherein the mass percentage of $ZrW_2O_8$ is about 15-35%, the remainder substantially AlON. The anti-corrosion layer 13 is deposited by magnetron sputtering. The anti-corrosion layer 13 has a thickness between about 0.5 micrometers ($\mu m$) and about 1.1 $\mu m$.

A method for manufacturing the coated article 10 may include at least the following steps:

Providing a substrate 11 that may be made of aluminum, aluminum alloy, magnesium or magnesium alloy.

Pretreating the substrate 11 by washing with a solution (e.g., Alcohol or Acetone) in an ultrasonic cleaner to remove impurities and contaminations, such as grease, or dirt, the substrate 11 is then dried. The substrate 11 is then cleaned by argon plasma cleaning.

Figure 2:
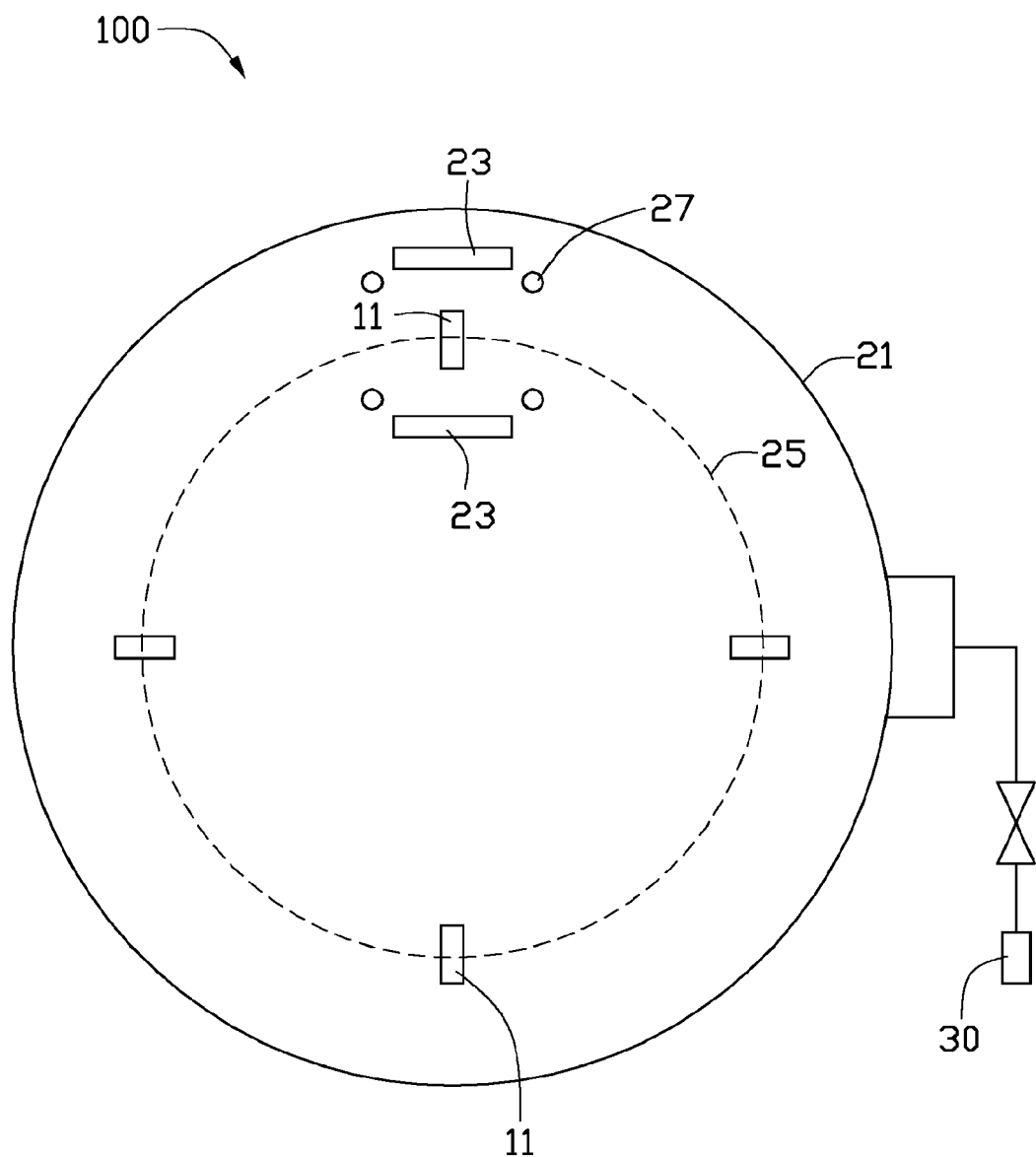
FIG. 2 is a schematic view of a magnetron sputtering coating machine for manufacturing the coated article of FIG. 1.

Providing a vacuum sputtering coating machine 20. Referring to FIG. 2, the vacuum sputtering coating machine 20 includes a sputtering coating chamber 21 and a vacuum pump 30 connected to the sputtering coating chamber 21. The vacuum pump 30 is used to evacuate the sputtering coating chamber 21. The vacuum sputtering coating machine 20 further includes two aluminum-based targets 23, a rotating bracket 25, and a plurality of gas inlets 27. The rotating bracket 25 rotates the substrate 11 in the sputtering coating chamber 21 relative to the aluminum-based targets 23. The aluminum-based targets 23 face each other, and are respectively located on opposite sides of the rotating bracket 25.

The aluminum-based targets 23 substantially comprising $ZrW_2O_8$ and aluminum, wherein the mass percentage of $ZrW_2O_8$ is about 20-40%, the remainder substantially aluminum. A method for manufacturing the aluminum-based targets 23 comprising the following steps: providing powders of $ZrW_2O_8$ and aluminum, wherein the mass percentage of the $ZrW_2O_8$ powder is about 20-40%, the remainder is aluminum powder; blending the $ZrW_2O_8$ and aluminum powders to produce a blended powder; compacting the blended powder by cold isostatic pressing (CIP); consolidating the compacted powder by vacuum sintering at a temperature of about 800 to about 880° C. for about 2 to about 5 hours. The method for manufacturing the aluminum-based target 23 further comprising: polishing the aluminum-based target 23 to smoothen the surfaces of the aluminum-based target 23.

Cleaning the aluminum-based targets 23 by argon (Ar) plasma. The substrate 11 is retained on a rotating bracket 25 in a sputtering coating chamber 21. The vacuum level inside the sputtering coating chamber 21 is set to about $3.0*10^{-5}$ Pa. Argon gas is fed into the sputtering coating chamber 21 at a flux rate about 500 Standard Cubic Centimeters per Minute (sccm) from the gas inlets 27. A bias voltage applied to the substrate 11 may be between about −50 volts (V) and about −150 volts. The argon particles strike against and clean the surface of aluminum-based targets 23.

An anti-corrosion layer 13 is deposited on the substrate 11. The temperature in the sputtering coating chamber 21 is set between about 100° C. (Celsius degree) and about 120° C. Argon gas is fed into the sputtering coating chamber 21 at a flux between about 100 Standard Cubic Centimeters per Minute (sccm) and about 300 sccm from the gas inlets 27. Nitrogen is fed into the sputtering coating chamber 20 at a flux between about 10 sccm and 20 sccm and oxygen is fed into the sputtering coating chamber 20 at a flux between about 10 sccm and 20 sccm from the gas inlets 27. The aluminum-based targets 23 in the sputtering coating chamber 21 are evaporated at a power between about 6 kW and about 8 kW. A bias voltage applied to the substrate 11 may be between about −50 volts and about −150 volts, for between about 30 minutes and about 120 minutes, to deposit the anti-corrosion layer 13 on the substrate 11. The anti-corrosion layer 13 has a thickness between about 0.5 $\mu m$ and about 1.1 $\mu m$. Once cooled down, the coated article 10 can be removed.

With the decrease of the temperature of the substrate 11 after depositing the anti-corrosion layer 13, $ZrW_2O_8$ is capable of expanding to fill gaps between the AlON particles due to their (i.e., the $ZrW_2O_8$) negative thermal expansion coefficient. Which makes the anti-corrosion layer 13 achieve a more compact structure relative to an AlON layer, thus can improve the corrosion resistance of the coated article 10.

It is to be understood that the method for manufacturing the coated article 10 may further includes depositing a bonding layer between the substrate 11 and the anti-corrosion layer 13 to improve bonding force between the substrate 11 and the anti-corrosion layer 13 so the anti-corrosion layer 13 can be firmly deposited on the substrate 30.

EXAMPLES

Experimental examples of the present disclosure are described as follows.

Example 1

A sample of aluminum alloy substrate was pretreated and then was placed into the sputtering coating chamber 21 of the vacuum sputtering coating machine 20. The temperature in the sputtering coating chamber 21 was set about 100° C. Argon was fed into the sputtering coating chamber 21 at a flux about 250 sccm from the gas inlets 27. Nitrogen was fed into the sputtering coating chamber 20 at a flux about 15 sccm and oxygen is fed into the sputtering coating chamber 20 at a flux between about 15 sccm from the gas inlets 27. The aluminum-based targets 23 in the sputtering coating chamber 21 were evaporated at a power about 6 kW. A bias voltage applied to the substrate 11 was between about −100 volts for about 60 minutes, to deposit an anti-corrosion layer on the aluminum alloy substrate.

The aluminum-based targets 23 were manufactured as follows. Providing powders of $ZrW_2O_8$ and aluminum wherein the mass percentage of the $ZrW_2O_8$ powder was about 50%, the remainder is aluminum powder; and the powders of $ZrW_2O_8$ and aluminum was blended to produce a blended powder. The blended powder was compacted by Cold Isostatic Pressing (CIP). Next, The compacted powder was then consolidated by vacuum sintering at a temperature of 810° C. for about 3.5 hours.

Example 2

Unlike the example 1, in the example 2, The substrate was made of magnesium alloy. The aluminum-based targets 23 were evaporated at a power between about 7 kW. The time of depositing the anti-corrosion layer 13 was about 75 minutes. The mass percentage of the $ZrW_2O_8$ powder was about 30% in the blended powders of $ZrW_2O_8$ and aluminum. The temperature of consolidating the compacted powder was about 880° C. Except the above difference, the remaining experiment conditions of example 2 were same as example 1. A substrate of magnesium alloy coated with an anti-corrosion layer was obtained according to example 2.

Comparison Example

Unlike the example 1, in the comparison example, the flux of the nitrogen was between about 80 sccm and the flux of the oxygen was between about 20 sccm. The aluminum-based targets were replaced by aluminum targets, and the aluminum targets in the sputtering coating chamber 21 are evaporated at a power about 8 kW. A bias voltage applied to the substrate was about −200 volts for about 40 minutes. Except the above difference, the remaining experiment conditions of comparison example were same with example 1. A substrate of aluminum alloy coated with an AlON layer was obtained according to comparison example.

The Salt Spray Test Results

The samples coated with the anti-corrosion layer and the sample coated with AlON layer were tested by salt spray test (35° C., 5% NaCl). The sample coated with AlON layer was subjected to the 72 hour salt spray test. But, the samples coated with the anti-corrosion layer were subjected to the 120 hour salt spray test. Thus, it is clear that The samples coated with the anti-corrosion layer have better corrosion resistance than the sample coated with AlON layer.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate; and
   an anti-corrosion layer deposited on the substrate, the anti-corrosion layer substantially comprising $ZrW_2O_8$ and AlON, the mass percentage of $ZrW_2O_8$ in the anti-corrosion layer being about 15-35%.

2. The coated article as claimed in claim 1, wherein the substrate is made of metallic material.

3. The coated article as claimed in claim 2, wherein the metallic material is selected from one of aluminum, aluminum alloy, magnesium and magnesium alloy.

4. The coated article as claimed in claim 1, wherein the anti-corrosion layer is deposited by magnetron sputtering.

5. The coated article as claimed in claim 1, wherein the anti-corrosion layer has a thickness between about 0.5 μm and about 1.1 μm.

6. The coated article as claimed in claim 1, wherein $ZrW_2O_8$ fills gaps between the AlON particles in the anti-corrosion layer.

* * * * *